United States Patent
Thimmegowda et al.

(10) Patent No.: US 9,219,132 B2
(45) Date of Patent: Dec. 22, 2015

(54) TRANSISTORS, SEMICONDUCTOR CONSTRUCTIONS, AND METHODS OF FORMING SEMICONDUCTOR CONSTRUCTIONS

(71) Applicant: Micron Technology, Inc., Boise, ID (US)

(72) Inventors: Deepak Thimmegowda, Fremont, CA (US); Andrew R. Bicksler, Nampa, ID (US); Roland Awusie, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/491,830

(22) Filed: Sep. 19, 2014

(65) Prior Publication Data

US 2015/0044834 A1 Feb. 12, 2015

Related U.S. Application Data

(62) Division of application No. 13/738,147, filed on Jan. 10, 2013, now Pat. No. 8,853,769.

(51) Int. Cl.
*H01L 21/3205* (2006.01)
*H01L 21/44* (2006.01)
(Continued)

(52) U.S. Cl.
CPC .... *H01L 29/66666* (2013.01); *H01L 21/28035* (2013.01); *H01L 21/28097* (2013.01);
(Continued)

(58) Field of Classification Search
CPC ............. H01L 27/1157; H01L 27/11582; H01L 21/28035; H01L 21/28097; H01L 29/66666; H01L 29/16

USPC ......................................................... 438/268
See application file for complete search history.

(56) References Cited

U.S. PATENT DOCUMENTS 6,057,193 A 5/2000 Wang et al.
6,063,666 A 5/2000 Chang et al.
(Continued)

FOREIGN PATENT DOCUMENTS

KR 10-2011-0000487 1/2011
KR 10-2011-0120654 11/2011
(Continued)

OTHER PUBLICATIONS

U.S. Appl. No. 13/675,933, filed Nov. 12, 2013, Davis et al.
(Continued)

*Primary Examiner* — Julio J Maldonado
*Assistant Examiner* — Moazzam Hossain
(74) *Attorney, Agent, or Firm* — Wells St. John P.S.

(57) ABSTRACT

Some embodiments include a transistor having a first electrically conductive gate portion along a first segment of a channel region and a second electrically conductive gate portion along a second segment of the channel region. The second electrically conductive gate portion is a different composition than the first electrically conductive gate portion. Some embodiments include a method of forming a semiconductor construction. First semiconductor material and metal-containing material are formed over a NAND string. An opening is formed through the metal-containing material and the first semiconductor material, and is lined with gate dielectric. Second semiconductor material is provided within the opening to form a channel region of a transistor. The transistor is a select device electrically coupled to the NAND string.

13 Claims, 8 Drawing Sheets

(51) Int. Cl.
  *H01L 21/30* (2006.01)
  *H01L 29/66* (2006.01)
  *H01L 29/78* (2006.01)
  *H01L 21/28* (2006.01)
  *H01L 29/16* (2006.01)
  *H01L 29/49* (2006.01)
  *H01L 27/115* (2006.01)

(52) U.S. Cl.
  CPC ............ *H01L29/16* (2013.01); *H01L 29/4925* (2013.01); *H01L 29/4983* (2013.01); *H01L 29/6653* (2013.01); *H01L 29/78* (2013.01); *H01L 29/7827* (2013.01); *H01L 29/7828* (2013.01); *H01L 27/1157* (2013.01); *H01L 27/11582* (2013.01)

(56) References Cited

U.S. PATENT DOCUMENTS

| | | | |
|---|---|---|---|
| 6,143,604 A | 11/2000 | Chiang et al. | |
| 6,180,454 B1 | 1/2001 | Chang et al. | |
| 6,274,471 B1 | 8/2001 | Huang | |
| 6,353,242 B1 | 3/2002 | Watanabe et al. | |
| 6,661,691 B2 | 12/2003 | Fricke et al. | |
| 6,803,318 B1 | 10/2004 | Qiao et al. | |
| 7,112,488 B2 | 9/2006 | Helm et al. | |
| 7,112,490 B1 | 9/2006 | Hong et al. | |
| 7,196,004 B2 | 3/2007 | Lee et al. | |
| 7,419,895 B2 | 9/2008 | Lindsay | |
| 7,713,819 B2 | 5/2010 | Okajima | |
| 7,829,935 B2 | 11/2010 | Makihara et al. | |
| 7,898,856 B2 | 3/2011 | Aritome | |
| 7,906,818 B2 | 3/2011 | Pekny | |
| 7,968,406 B2 | 6/2011 | Ramaswamy et al. | |
| 8,148,216 B2 | 4/2012 | Arai et al. | |
| 8,183,110 B2 | 5/2012 | Ramaswamy et al. | |
| 8,187,938 B2 | 5/2012 | Lim et al. | |
| 8,237,213 B2 | 8/2012 | Liu | |
| 8,278,695 B2 | 10/2012 | Kidoh et al. | |
| 8,283,205 B2 | 10/2012 | Pagalia et al. | |
| 8,288,811 B2 | 10/2012 | Ramaswamy et al. | |
| 8,437,192 B2 | 5/2013 | Lung et al. | |
| 8,507,976 B2 | 8/2013 | Joo | |
| 8,969,153 B2 * | 3/2015 | Lee et al. ...................... | 438/258 |
| 2003/0201500 A1 * | 10/2003 | Furukawa et al. ............ | 257/368 |
| 2005/0200026 A1 | 9/2005 | Liaw | |
| 2007/0004141 A1 | 1/2007 | Kim et al. | |
| 2008/0009113 A1 | 1/2008 | Shimizu | |
| 2008/0179659 A1 | 7/2008 | Enda et al. | |
| 2009/0117725 A1 | 5/2009 | Sun | |
| 2009/0230454 A1 | 9/2009 | Pekny | |
| 2009/0289297 A1 | 11/2009 | Kim et al. | |
| 2009/0296476 A1 | 12/2009 | Shin et al. | |
| 2009/0310425 A1 * | 12/2009 | Sim et al. ................. | 365/185.29 |
| 2010/0155813 A1 | 6/2010 | Murata et al. | |
| 2010/0171162 A1 | 7/2010 | Katsumata et al. | |
| 2010/0208503 A1 | 8/2010 | Kuo | |
| 2010/0258852 A1 | 10/2010 | Lim et al. | |
| 2011/0031550 A1 | 2/2011 | Komori et al. | |
| 2011/0149656 A1 | 6/2011 | Tang et al. | |
| 2011/0177661 A1 | 7/2011 | Song et al. | |
| 2011/0180865 A1 | 7/2011 | Ramaswamy | |
| 2011/0193153 A1 | 8/2011 | Higuchi et al. | |
| 2011/0241098 A1 * | 10/2011 | Park et al. ...................... | 257/324 |
| 2012/0001249 A1 | 1/2012 | Alsmeier et al. | |
| 2012/0012921 A1 | 1/2012 | Liu | |
| 2012/0068247 A1 | 3/2012 | Lee et al. | |
| 2012/0086072 A1 | 4/2012 | Yun et al. | |
| 2012/0119285 A1 | 5/2012 | Yang | |
| 2012/0175697 A1 | 7/2012 | Hall et al. | |
| 2012/0184078 A1 | 7/2012 | Kiyotoshi | |
| 2012/0193596 A1 | 8/2012 | Nakazawa | |
| 2012/0211822 A1 | 8/2012 | Lim et al. | |
| 2012/0217564 A1 | 8/2012 | Tang et al. | |
| 2012/0231593 A1 | 9/2012 | Joo et al. | |
| 2012/0241842 A1 | 9/2012 | Matsuda | |
| 2012/0329224 A1 | 12/2012 | Kong et al. | |
| 2013/0193503 A1 * | 8/2013 | Lee et al. ...................... | 257/314 |
| 2014/0008714 A1 * | 1/2014 | Makala et al. ................. | 257/324 |

FOREIGN PATENT DOCUMENTS

| | | |
|---|---|---|
| KR | 10-2012-0113596 | 10/2012 |
| WO | PCT/US2013/063302 | 1/2014 |
| WO | PCT/US2014/011228 | 4/2014 |

OTHER PUBLICATIONS

U.S. Appl. No. 13/708,789, filed Dec. 7, 2012, Keshav et al.
U.S. Appl. No. 13/735,908, filed Jan. 7, 2013, Hopkins.
U.S. Appl. No. 13/738,147, filed Jan. 10, 2013, Thimmegowa et al.
U.S. Appl. No. 13/748,747, filed Dec. 4, 2013, Hopkins et al.
U.S. Appl. No. 13/759,627, filed Feb. 5, 2013, Thimmegowa et al.
U.S. Appl. No. 13/894,481, filed May 5, 2013, Ramaswamy.
U.S. Appl. No. 13/894,631, filed May 15, 2013, Ramaswamy.

* cited by examiner

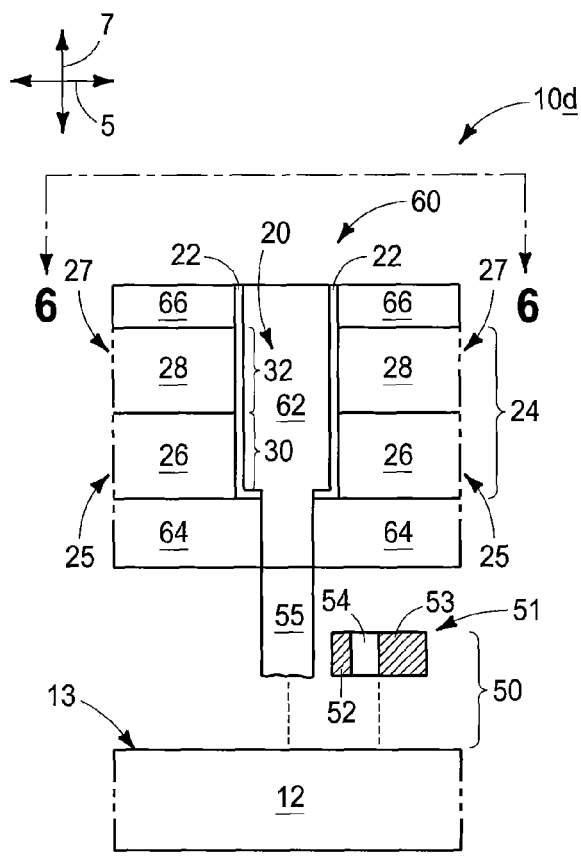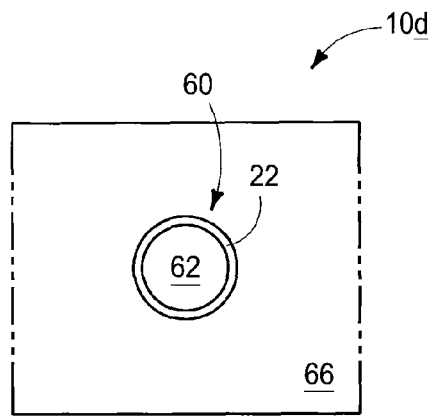
FIG. 5
FIG. 6
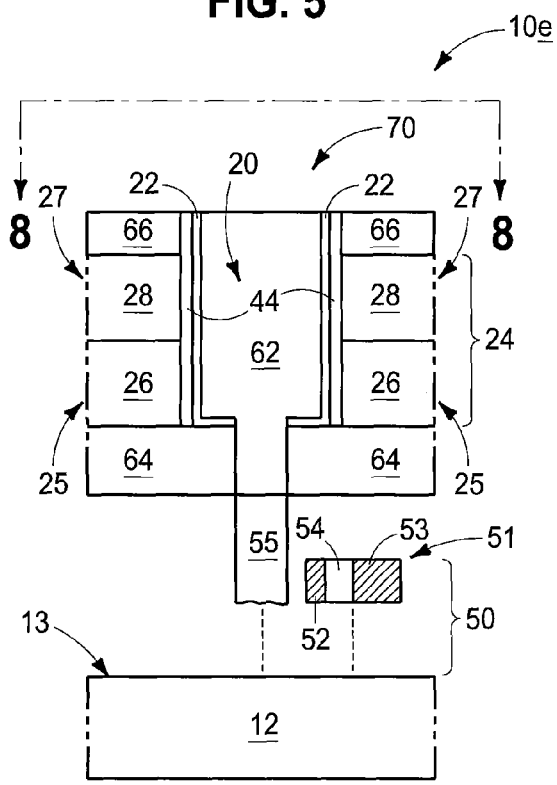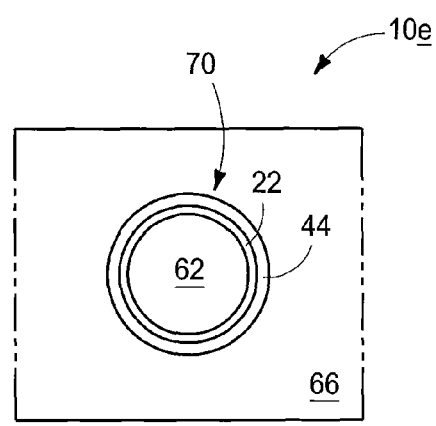
FIG. 7
FIG. 8

US 9,219,132 B2

TRANSISTORS, SEMICONDUCTOR CONSTRUCTIONS, AND METHODS OF FORMING SEMICONDUCTOR CONSTRUCTIONS

RELATED PATENT DATA

This patent resulted from a divisional of U.S. patent application Ser. No. 13/738,147, which was filed Jan. 10, 2013, and which is hereby incorporated herein by reference.

TECHNICAL FIELD

Transistors, semiconductor constructions, and methods of forming semiconductor constructions.

BACKGROUND

A field effect transistor (FET) is a three-channel circuit device comprising a gated channel region between a source and a drain. FETs have numerous applications in integrated circuitry. For instance, FETs may be utilized in memory; and may be, for example, utilized in combination with capacitors to form dynamic random access memory (DRAM) unit cells; utilized as select devices relative to NAND strings; utilized as select devices for controlling access to programmable metallization cells (PMCs); etc. Additionally, or alternatively, FETs may be utilized in logic.

There are continuing goals to develop improved FETs and improved methods of forming FETs.

BRIEF DESCRIPTION OF THE DRAWINGS

FIGS. 5 and 6 are a diagrammatic cross-sectional side view and a diagrammatic top view, respectively, of a portion of a semiconductor construction illustrating an example embodiment vertical transistor configured as a select device coupled to a vertical NAND string. The top view of FIG. 6 is along a line 6-6 of FIG. 5.

FIGS. 7 and 8 are a diagrammatic cross-sectional side view and a diagrammatic top view, respectively, of a portion of a semiconductor construction illustrating another example embodiment vertical transistor configured as a select device coupled to a vertical NAND string. The top view of FIG. 8 is along a line 8-8 of FIG. 7.

DETAILED DESCRIPTION OF THE ILLUSTRATED EMBODIMENTS

In some embodiments, new FETs are configured to comprise gates having at least two different conductive materials which are each along a different segment of a channel region. In some embodiments, such FETs are configured as vertical devices, and are utilized as select devices which are electrically coupled to vertical NAND strings. Example embodiments are described below with reference to FIGS. 1-19.

Figure 1:
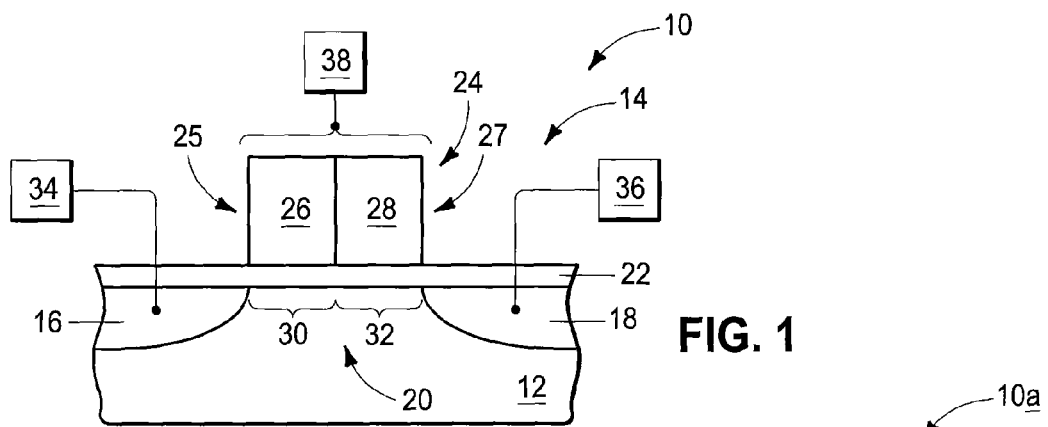
FIGS. 1-4 are diagrammatic cross-sectional side views of example embodiment transistors.

Referring to FIG. 1, a semiconductor construction 10 comprises a base 12 supporting an example embodiment transistor 14.

The base 12 may comprise semiconductor material, and in some embodiments may comprise, consist essentially of, or consist of monocrystalline silicon. In some embodiments, base 12 may be considered to comprise a semiconductor substrate. The term "semiconductor substrate" means any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above. In some embodiments, base 12 may correspond to a semiconductor substrate containing one or more materials associated with integrated circuit fabrication. Some of the materials may be under the shown region of base 12 and/or may be laterally adjacent the shown region of base 12; and may correspond to, for example, one or more of refractory metal materials, barrier materials, diffusion materials, insulator materials, etc.

The transistor 14 comprises a pair of conductively-doped source/drain regions 16 and 18 extending into base 12. The source/drain regions may be majority n-type doped in some embodiments, and may be majority p-type doped in other embodiments.

A channel region 20 is within base 12 between the source/drain regions 16 and 18. Such channel region may be doped with appropriate dopant.

A gate dielectric 22 extends across the channel region 20, and in the shown embodiment also extends across the source/drain regions 16 and 18. The gate dielectric is directly against the channel region. The gate dielectric may comprise any suitable composition or combination of compositions; and in some embodiments may comprise, consist essentially of, or consist of one or more of silicon dioxide, silicon nitride, aluminum oxide, hafnium oxide, zirconium oxide, etc. Although the gate dielectric is shown as a single homogeneous electrically insulative composition, in other embodiments the gate dielectric may comprise two or more discrete electrically insulative compositions; such as, for example, two or more discrete compositions stacked one on top of another.

A gate 24 is over the gate dielectric 22. The gate 24 comprises a first electrically conductive gate portion 25 and a second electrically conductive gate portion 27; with portions 25 and 27 comprising materials 26 and 28, respectively. The portions 25 and 27 are directly against one another in a side-by-side arrangement over the channel region.

The materials 26 and 28 are of different compositions relative to one another, and may comprise any suitable compositions. In some example embodiments, one of the materials 26 and 28 comprises, consists essentially of, or consists of conductively-doped semiconductor material (for instance, conductively-doped silicon, conductively-doped germanium, etc.); and the other comprises, consists essentially of, or consists of metal (for instance, comprises elemental metal, metal nitride, metal silicide, etc.). In some embodiments, the portion 26 may consist of n-type doped silicon (e.g., n-type doped polysilicon) or p-type doped silicon (e.g., p-type doped polysilicon); and the portion 28 may comprise, consist essentially of, or consist of titanium nitride or tungsten silicide.

The channel region 20 may be considered to comprise a first segment 30 and a second segment 32. The portions 25 and 27 of gate 24 are along the first and second segments 30 and 32 of the channel region, respectively; and are spaced from such segments by gate dielectric 22. In the shown embodiment, the first and second portions 25 and 27 of gate 24 are directly against gate dielectric 22. In other embodiments, such portions may be spaced from the gate dielectric by an intervening electrically conductive material (as discussed below with reference to FIGS. 3 and 4).

The source and drain regions 16 and 18 are shown to be electrically coupled to circuitry 34 and 36, respectively, and the gate is shown to be electrically coupled to circuitry 38. The transistor 14 is a FET. In operation gate 24 can be utilized to impart an electric field to the channel region 20 to alter conductivity through the channel region, and to thereby gatedly couple source/drain regions 16 and 18 to one another.

One of the source/drain regions 16 and 18 is a source region and the other is a drain region. In some example embodiments, the gate portions 25 and 27 may be a semiconductor-containing gate portion and a metal-containing gate portion, respectively, and the source/drain regions 16 and 18 may be arranged to put the drain region adjacent the metal-containing gate portion. In other example embodiments in which the gate portions 25 and 27 are a semiconductor-containing gate portion and a metal-containing gate portion, respectively, the source/drain regions 16 and 18 may be arranged to put the drain region adjacent to the semiconductor-containing gate portion.

Figure 2:
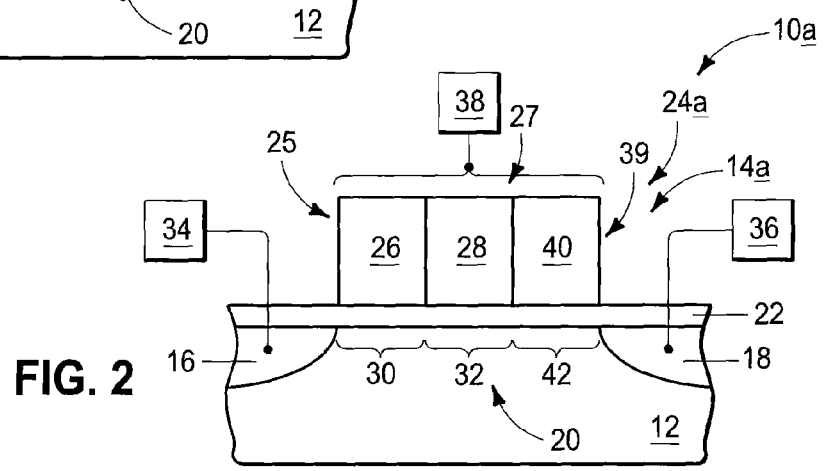

The example embodiment of FIG. 1 comprises a gate having two discrete portions. In other embodiments, a gate may comprise more than two discrete portions. For instance, FIG. 2 shows a construction 10a illustrating a transistor 14a having a gate 24a with three discrete portions 25, 27 and 39 which comprise materials 26, 28 and 40, respectively. In some embodiments, the portions 25 and 39 may be semiconductor-containing portions, and the portion 27 may be a metal-containing portion. In other embodiments, the portions 25 and 39 may be metal-containing portions, and the portion 27 may be a semiconductor-containing portion. In some embodiments, the materials 26 and 40 of portions 25 and 39 may comprise the same composition as one another, and in other embodiments the materials 26 and 40 may be of different compositions relative to one another.

The channel region 20 of FIG. 2 may be considered to comprise a third segment 42, in addition to the first and second segments 30 and 32; with the portion 39 of gate 24a being along such third segment of the channel region, and being spaced from the third segment by gate dielectric 22.

Figure 3:
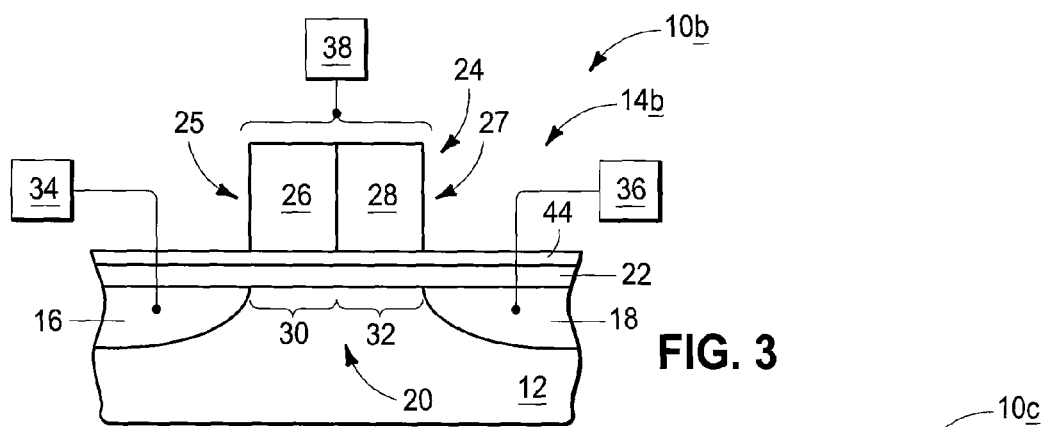

In some embodiments, the portions of the transistor gate may be spaced from gate dielectric by electrically conductive material. For instance, FIG. 3 shows a construction 10b illustrating a transistor 14b having a gate 24 spaced from gate dielectric 22 by an electrically conductive material 44. In some embodiments, the electrically conductive material 44 may comprise, consist essentially of, or consist of conductively-doped semiconductor material (for instance, one or more of conductively-doped silicon, conductively-doped germanium, etc.). The electrically conductive material 44 may be thin in some embodiments to enable good electrical coupling between portions 25 and 27 of gate 24 with the underlying segments 30 and 32 of channel region 20. For instance, in some embodiments material 44 may have a thickness of less than or equal to about 100 Å; such as, for example, a thickness within a range of from about 5 Å to about 100 Å.

Figure 4:
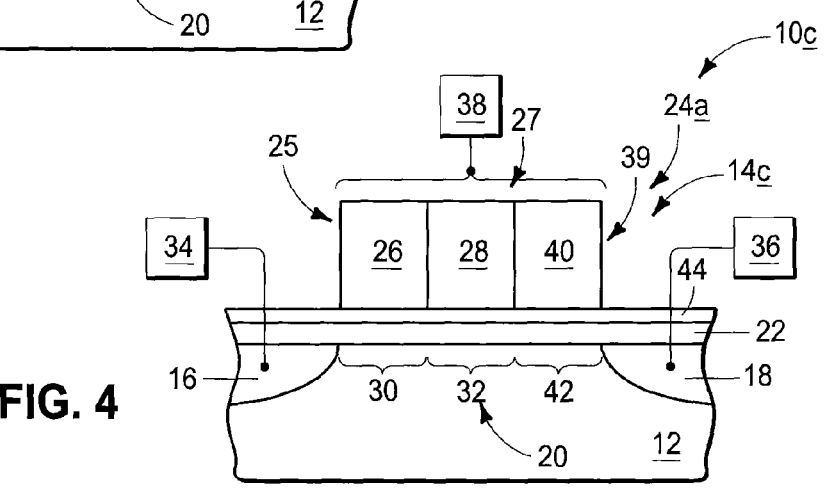

The example embodiment of FIG. 3 comprises a gate having two discrete portions, but in other embodiments a gate may comprise more than two discrete portions. FIG. 4 shows a construction 10c illustrating a transistor 14c having a gate 24a of the type described above with reference to FIG. 2, (i.e., a gate having three discrete portions 25, 27 and 39) utilized in combination with the electrically conductive material 44 between the gate and the gate dielectric 22.

In some example embodiments, transistors analogous to those described above with reference to FIGS. 1-4 may be utilized in NAND memory arrays as select devices coupling to NAND strings. FIG. 5 shows a semiconductor construction 10d having a NAND string 50 supported by a semiconductor base 12. The NAND string extends vertically over an upper surface of the base. Specifically, the base has a substantially horizontal primary surface 13 (e.g., an upper surface of a semiconductor wafer corresponding to base 12 in some embodiments) extending along a direction of an axis 5, and the NAND string extends along a direction of an axis 7 which is substantially orthogonal to the axis 5.

The NAND string comprises multiple levels of memory cells 51 arranged one on top of the other over base 12. One of such memory cells is shown in FIG. 5 to comprise a charge-storage material 52 spaced from a control gate material 53 by dielectric material 54. The charge-storage material may comprise any suitable composition or combination of compositions. In some embodiments, the charge-storage material may be configured as a floating gate, and accordingly may comprise silicon. In other embodiments, the charge-storage material may be configured as a charge trap, and accordingly may comprise silicon nitride, nanodots, etc. The dielectric material 54 may comprise any suitable composition or combination of compositions, including, for example, one or more of various oxides (for instance, silicon dioxide, aluminum oxide, hafnium oxide, zirconium oxide, etc.). The control gate material 53 may comprise any suitable composition or combination of compositions; and in some embodiments may comprise, consist essentially of, or consist of conductively-doped silicon.

The NAND string 50 comprises a NAND string channel material 55. Such channel material may comprise any suitable composition or combination of compositions; and in some embodiments may comprise, consist essentially of, or consist of appropriately-doped silicon. The gate 51 is adjacent the NAND string channel material 55, and there would be a gate dielectric (not shown) between the charge-storage material 52 and the channel material 55.

The memory cell 51 may be representative of a large number of memory cells incorporated into a string of memory cells. For instance, in some embodiments the string of memory cells may comprise 8 cells, 16 cells, 32 cells, 64 cells, etc.

A transistor 60 is over the NAND string and electrically coupled with the NAND string channel material 55. The transistor 60 is analogous to the transistor 14 of FIG. 1, but is a vertical device rather than the planar device shown in FIG. 1. Specifically, transistor 60 comprises a channel 20 which is elongated along a vertical direction (i.e., a direction of axis 7) rather than along a horizontal direction.

The transistor 60, like the transistor 14 of FIG. 1, has a gate 24 comprising two portions 25 and 27, and such gate is separated from the channel region 20 by gate dielectric 22. The channel region 20 is within a semiconductor material 62, which in some embodiments may comprise, consist essentially of, or consist of appropriately-doped silicon. The materials 62 and 55 may be the same material as one another in some embodiments, and may, for example, be comprised by a single pillar of polysilicon.

The gate portions 25 and 27 are along vertically-offset segments 30 and 32 of channel region 20, respectively.

Source/drain regions 16 and 18 (shown in FIG. 1, and not shown in FIG. 5) may be formed within material 62 on opposing sides of channel region 20 from one another. Alternatively, an entirety of material 62 may be uniformly doped (and such doping may also extend into or entirely through, material 55 in some embodiments). In other example embodiments, a region analogous to source/drain region 18 may be formed within material 62 while the rest of material 62 remains uniformly doped.

The construction 10d comprises a first electrically insulative material 64 under gate portion 25, and a second electrically insulative material 66 over gate portion 27. The electrically insulative material 64 may be utilized for electrical isolation between gate portion 25 and other materials underlying such gate portion, such as, for example, materials associated with NAND string 50. Similarly, the electrically insulative material 66 may be utilized for electrical isolation between gate portion 27 and other materials overlying such gate portion. In some example embodiments, electrically insulative material 64 may comprise, consist essentially of, or consist of silicon dioxide; and electrically insulative material 66 may comprise, consist essentially of, or consist of silicon nitride.

In some embodiments, material 26 of gate portion 25 may consist of conductively-doped silicon (for instance, n-type doped silicon) having a thickness within a range of from about 50 nm to about 200 nm; and material 28 of gate portion 27 may consist of tungsten silicide or titanium nitride having a thickness within a range of from about 10 nm to about 100 nm. In such embodiments, the relative thicknesses of the portions 25 and 27 may be tailored to achieve desired properties. In some embodiments, the semiconductor-containing gate portion 25 may be at least about 50% thicker than the metal-containing gate portion 27. In some embodiments, the metal-containing portion of gate 24 may be under the semiconductor-containing portion, and in other embodiments may be over the semiconductor-containing portion.

FIG. 6 shows a top view of construction 10d, and shows that the channel region 62 may be configured as a pillar extending upwardly through gate portions 25 and 27. Such pillar is laterally surrounded by the gate dielectric 22. The portions 25 and 27 of gate 24 entirely laterally surround such pillar-shaped channel region in the shown embodiment.

FIGS. 5 and 6 show a vertical device analogous to the transistor configuration of FIG. 1. In other embodiments, vertical devices may be formed to be analogous to one or more of the transistor configurations of FIGS. 2-4. For instance, FIGS. 7 and 8 show a construction 10e similar to that of FIGS. 5 and 6, but utilizing a transistor 70 based on the configuration of FIG. 3, rather than the transistor based on the configuration of FIG. 1. Accordingly, the construction 10e of FIGS. 7 and 8 comprises the electrically conductive material 44 between the dielectric material 22 and the gate portions 25 and 27.

Although individual transistors and NAND strings are shown in FIGS. 5-8, such individual transistors and NAND strings may be representative of a large number of substantially identical devices formed across a semiconductor construction. For instance, the transistors and NAND strings of FIGS. 5-8 may be representative of a large number of substantially identical devices incorporated into a NAND memory array.

The vertically-oriented transistors of FIGS. 5 and 7 are shown utilized in conjunction with NAND strings. In other embodiments, analogous vertically-oriented transistors may be utilized in other applications, such as, for example, DRAM and/or logic.

The constructions of FIGS. 1-8 may be considered to correspond to hybrid gates, in that the gates comprise two or more different materials incorporated therein. Prior art gate constructions utilized multiple gate materials stacked over one another so that all of the gate materials were over a common segment of a channel region, (example prior art devices utilizing both metal-containing material and semiconductor-containing material in transistor gates are metal-strapped devices). In contrast to prior art devices, the constructions of FIGS. 1-8 have each of the separate materials of the gate over a separate segment of the channel. Such can provide advantages in tailoring the gates for applications associated with highly integrated circuitry. For instance, the embodiments of FIGS. 5-8 may utilize hybrid gates in vertically-oriented select drain devices as part of NAND memory arrays. Such gates may enable higher threshold voltage and reduced resistance-capacitance (RC) as compared to prior art devices. Further, the footprint of the devices of FIGS. 5-8 may be reduced relative to conventional metal-strapped devices due to the elimination of the strapping constituent.

The constructions described above with reference to FIGS. 1-8 may be formed with any suitable processing. Some example methods are described below with reference to FIGS. 9-19.

Figure 9:
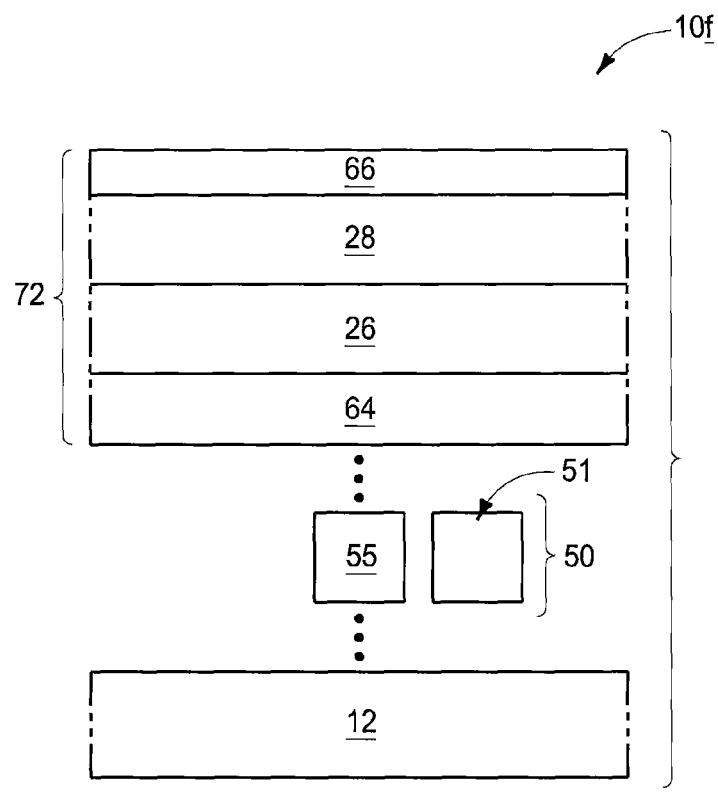
FIGS. 9-13 are diagrammatic cross-sectional side views of a portion of a semiconductor construction at various process stages of an example embodiment method of forming an example embodiment vertical transistor.

Referring to FIG. 9, a construction 10f is shown to comprise a vertically-extending NAND string 50 formed over a base 12 (the NAND string of FIG. 9 is shown more diagrammatically than the NAND strings of FIGS. 5 and 7, but may comprise a similar configuration as the NAND strings of FIGS. 5 and 7).

A stack 72 is formed over the NAND string. The stack comprises the materials 64, 26, 28 and 66. In some embodiments such materials may be referred to as a first electrically insulative material, first semiconductor material, metal-containing material, and second electrically insulative material, respectively. The stack 72 may be formed by forming the various materials 64, 26, 28 and 66 on top of one another with any suitable processing including, for example, one or more of atomic layer deposition (ALD) and chemical vapor deposition (CVD) and physical vapor deposition (PVD).

Figure 10:
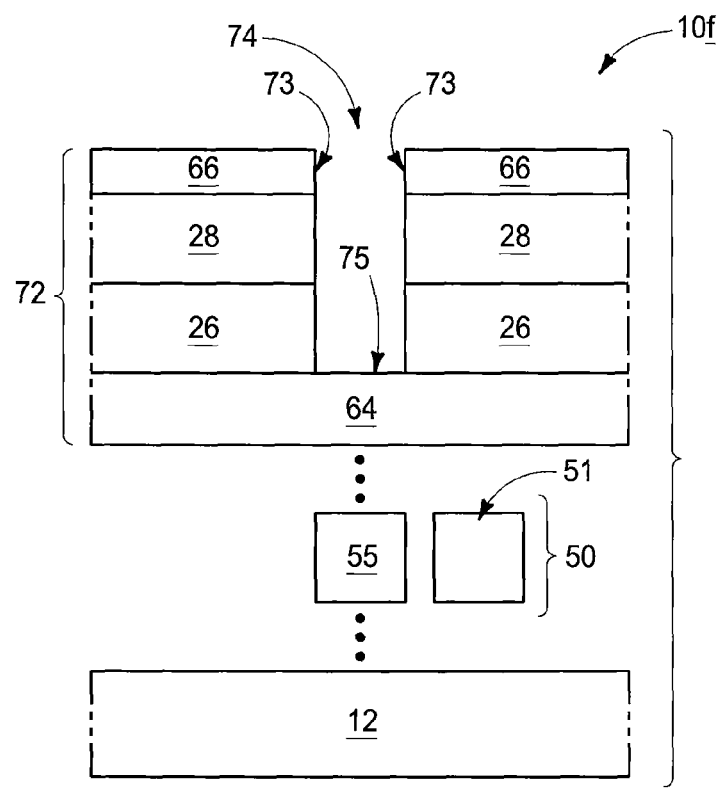

Referring to FIG. 10, an opening 74 is formed to extend through the materials 26, 28 and 66, and to an upper surface of electrically insulative material 64. Such opening may be formed with any suitable processing. For instance, in some embodiments a mask (for instance, a photolithographically-patterned photoresist mask and/or a mask formed by pitch-modification methodologies) may be formed over stack 72 to define a location of opening 74; one or more etches may be utilized to transfer a pattern from the mask into materials 26, 28 and 66 to thereby form opening 74; and then the mask may be removed to leave the construction shown in FIG. 10. In some embodiments, the mask may be utilized in combination with carbon and/or antireflective material (not shown).

The opening 74 has sidewalls 73 along materials 26, 28 and 66, and has a bottom 75 along material 64. Although the opening appears to have two separate sidewalls in the cross-section of view of FIG. 10, in some embodiments the sidewalls may merge to form a single sidewall. For instance, the opening 74 may have a circular shape, or other closed shape, when viewed from above (for instance, may have a shape analogous to the circular shape shown in the top view of FIG. 6).

Figure 11:
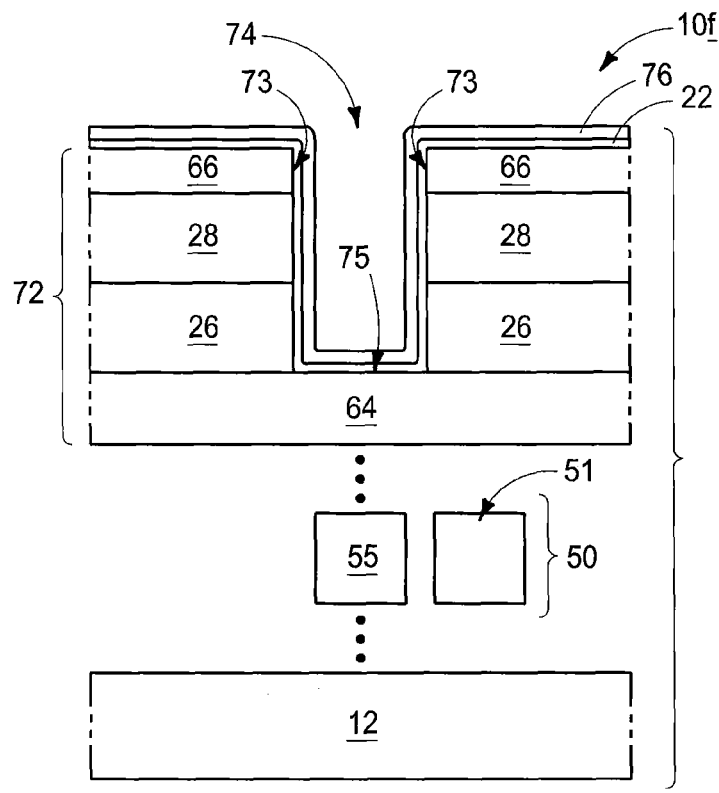

Referring to FIG. 11, gate dielectric 22 is formed over stack 72 and within opening 74, and then a spacer material 76 is formed over the gate dielectric 22. The gate dielectric and spacer material may be formed with any suitable processing, including, for example, one or more of ALD, CVD and PVD. The gate dielectric 22 and spacer material 76 extend along the sidewalls 73 and bottom 75 of opening 74, and only partially fill such opening.

The spacer material 76 may comprise any suitable composition. In some embodiments, the spacer material is ultimately incorporated into semiconductor material utilized for a channel region, and thus may comprise a same composition as the rest of the semiconductor material (e.g., in some embodiments the spacer material may comprise, consist essentially of, or consist of silicon). In such embodiments, the spacer material may be referred to as a semiconductor material liner. In other embodiments, spacer material 76 may be a sacrificial material, and thus may comprise any composition which may be selectively removed relative to other compositions of construction 10f.

Figure 12:
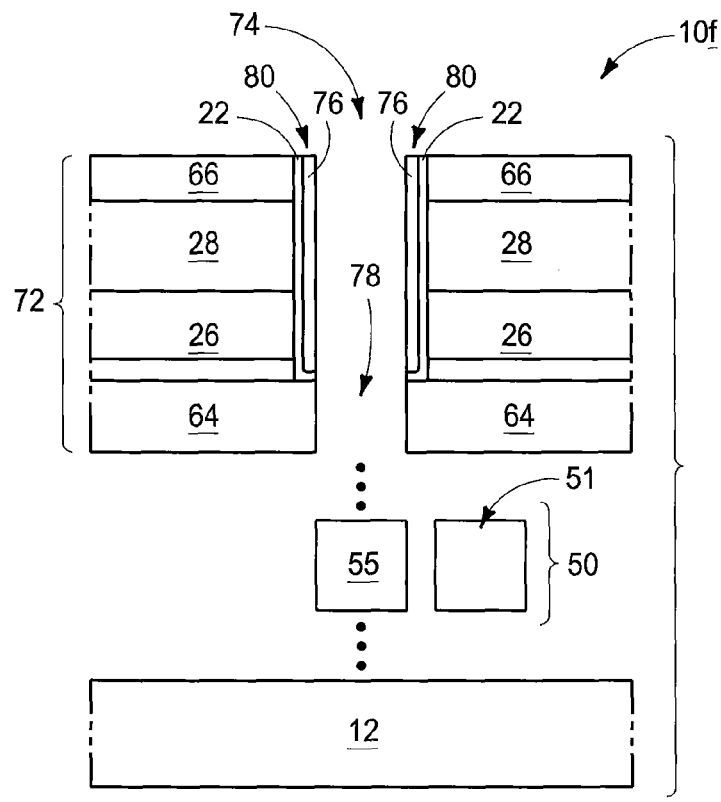

Referring to FIG. 12, the materials 22 and 76 are subjected to anisotropic etching. Such removes materials 22 and 76 from over a top surface of material 66, and exposes material 64 along the bottom of opening 74. In the shown embodiment, the etching has continued through material 64 to punch an opening 78 through material 64. In some embodiments, openings 74 and 78 may be referred to as a first opening and a second opening, respectively. In some embodiments, spacer material 76 may be considered to be utilized as a mask during formation of opening 78.

The anisotropic etching of the spacer material 76 may be considered to pattern such material into spacers 80 along sidewalls of opening 74. Although there appear to be two spacers 80 in the cross-sectional view of FIG. 12, in some embodiments such spacers may be comprised by a single spacer that forms an annular ring within a circular-shaped opening 74.

Figure 13:
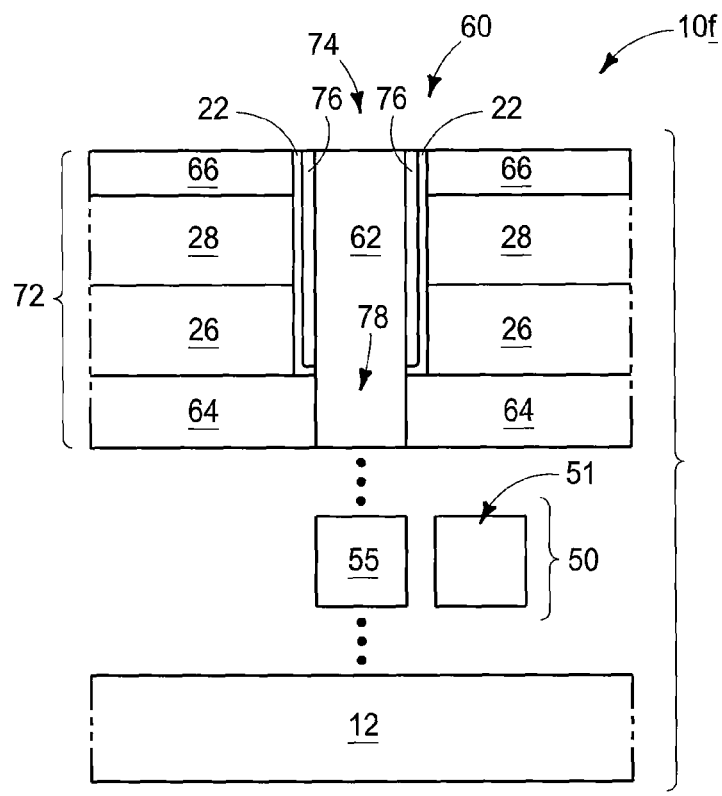

Referring to FIG. 13, semiconductor material 62 is formed within the first and second openings 74 and 78. In some embodiments, one or both of the source/drain regions 16 and 18 (shown in FIG. 1, but not in FIG. 13) may be formed in material 62, and in other embodiments the entirety of material 62 may be uniformly doped. The materials 62 and 76 may have a same composition as one another, and accordingly the construction of FIG. 13 may comprise a transistor 60 identical to the transistor described above with reference to FIG. 5. In some embodiments, the semiconductor material 62 may be referred to as a second semiconductor material to distinguish it from the first semiconductor material 26.

Figure 14:
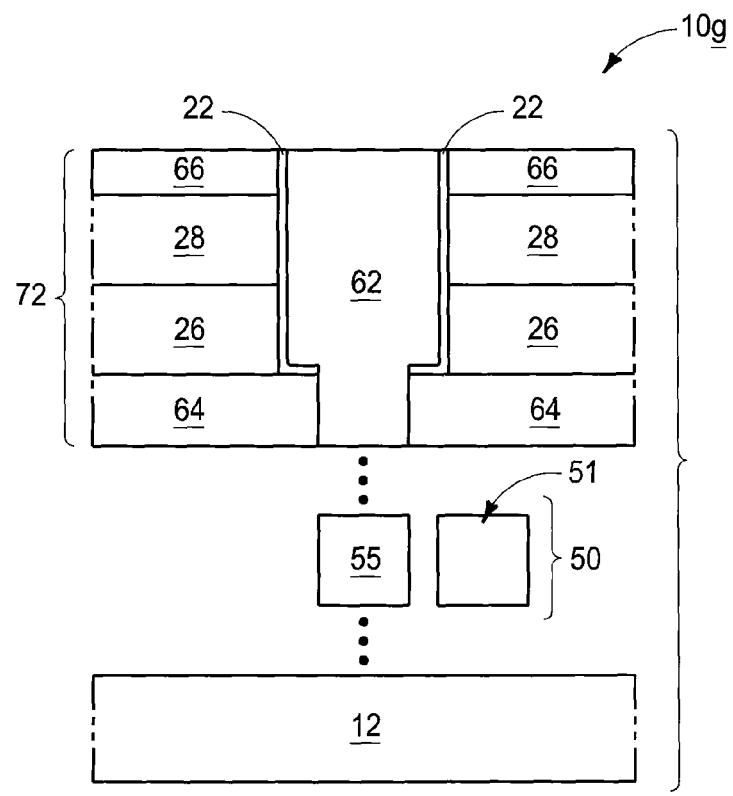
FIG. 14 is a diagrammatic cross-sectional side view of a portion of a semiconductor construction at a process stage of another example embodiment method of forming an example embodiment vertical transistor. The process stage of FIG. 14 may follow that of FIG. 12 in some embodiments.

In some embodiments, spacer material 76 may be a sacrificial material, and may be removed prior to formation of semiconductor material 62. FIG. 14 shows a construction 10g at a processing stage subsequent to that of FIG. 12 in accordance with an embodiment in which spacer material 76 is removed prior to formation of semiconductor material 62.

Figure 15:
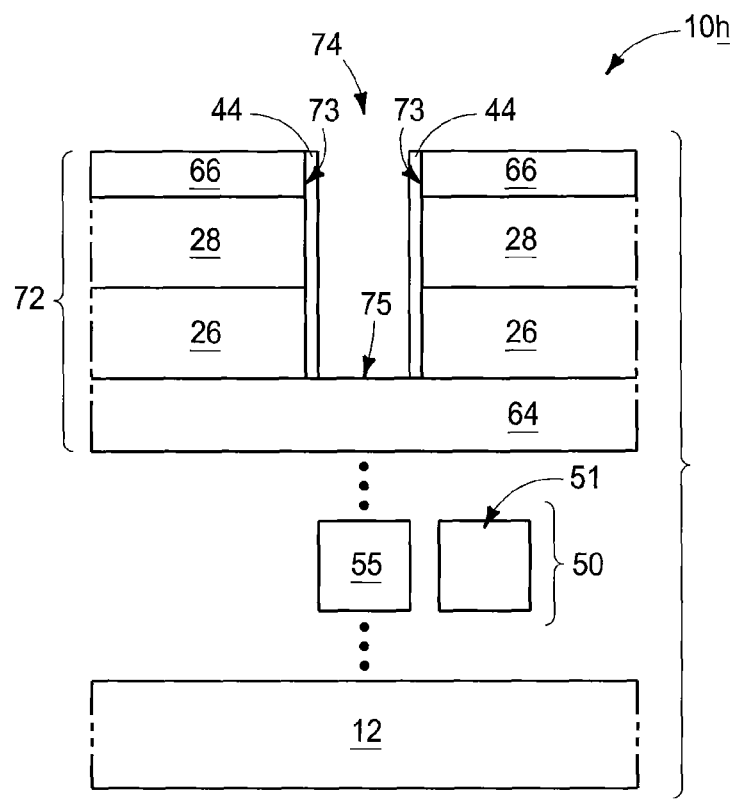
FIGS. 15-18 are diagrammatic cross-sectional side views of a portion of a semiconductor construction at various process stages of another example embodiment method of forming an example embodiment vertical transistor. The process stage of FIG. 15 may follow that of FIG. 10 in some embodiments.

In some embodiments, the electrically conductive material 44 (FIGS. 3, 4, 7 and 8) may be formed prior to forming dielectric material 22. For instance, FIG. 15 shows a construction 10h at a processing stage which may be subsequent to that of FIG. 10 in some embodiments, (in the shown embodiment, the opening 74 of FIG. 15 is wider than that of FIG. 10 in order to improve legibility of the drawings as additional materials are formed in the opening in subsequent steps). Material 44 has been formed as a conductive liner along sidewalls of opening 74. Such conductive liner may be formed by any suitable method. For example, material 44 may be formed across an upper surface of stack 72 and along the sidewalls 73 and bottom 75 of opening 74 utilizing one or more of ALD, PVD and CVD. Subsequently, material 44 may be subjected to anisotropic etching to form the configuration of FIG. 15.

Figure 16:
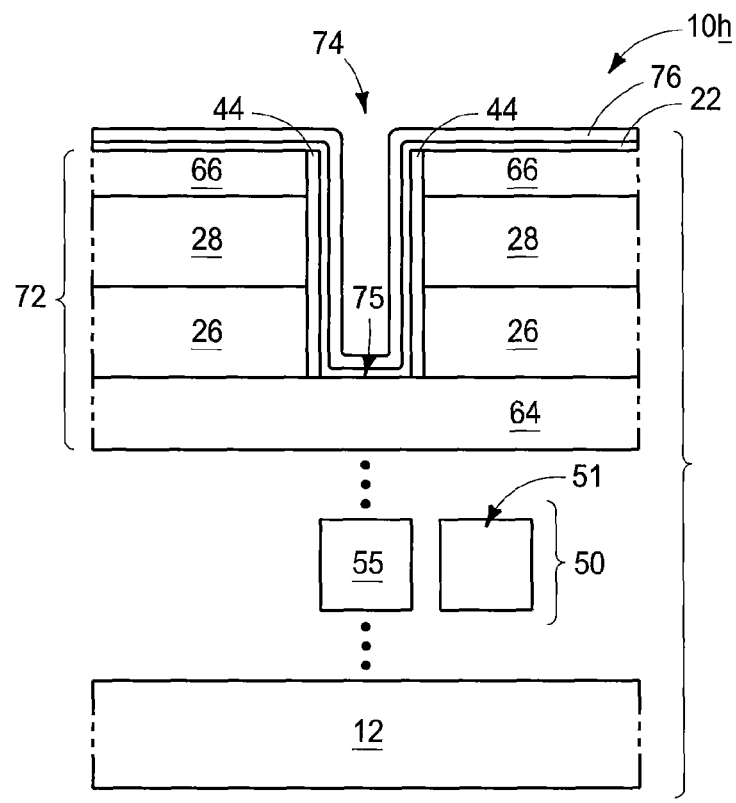

Referring to FIG. 16, gate dielectric 22 and spacer material 76 are formed across stack 72 and within opening 74 utilizing processing analogous to that described above with reference to FIG. 11.

Figure 17:
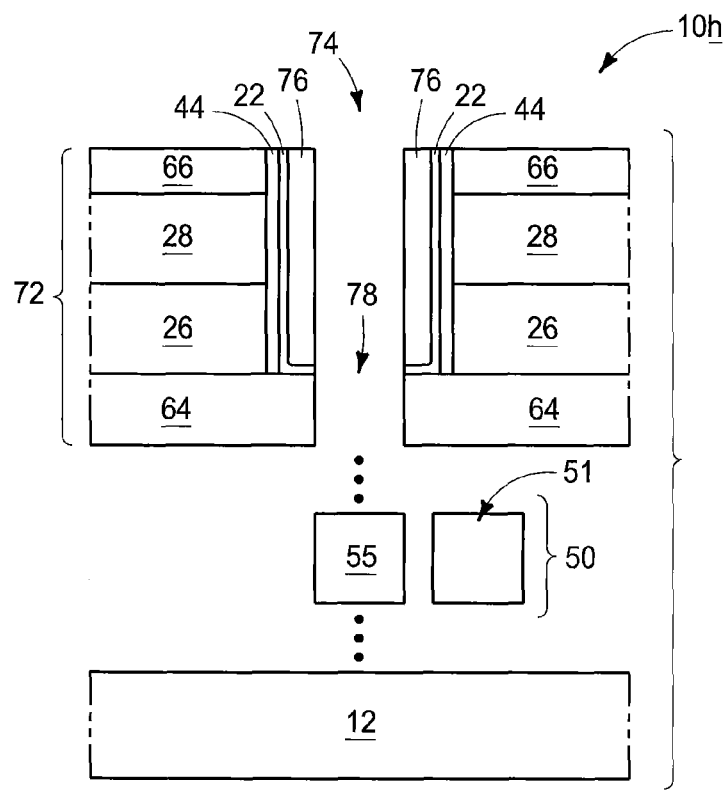

Referring to FIG. 17, materials 22 and 76 are anisotropically etched with processing analogous to that described above with reference to FIG. 12, and then the second opening 78 is punched through material 64. Although material 44 is shown to be anisotropically etched prior to forming materials 22 and 76 within the opening 74, in other embodiments the materials 22 and 76 may be formed over material 44 without first anisotropically etching material 44. In such other embodiments, material 44 may be etched with materials 22 and 76 at the processing stage of FIG. 17 to pattern the location for the opening 78.

Figure 18:
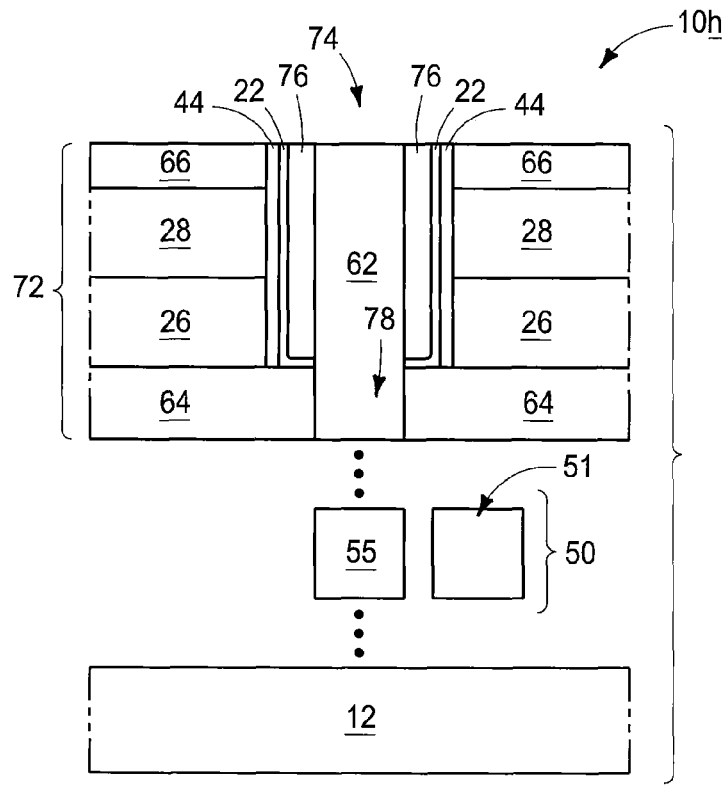

Referring to FIG. 18, semiconductor material 62 is formed within openings 74 and 78. In some embodiments, materials 62 and 76 may be a same composition as one another so that such materials merge to form a single material, and thus the construction of FIG. 18 may be identical to that described above with reference to FIG. 7.

Figure 19:
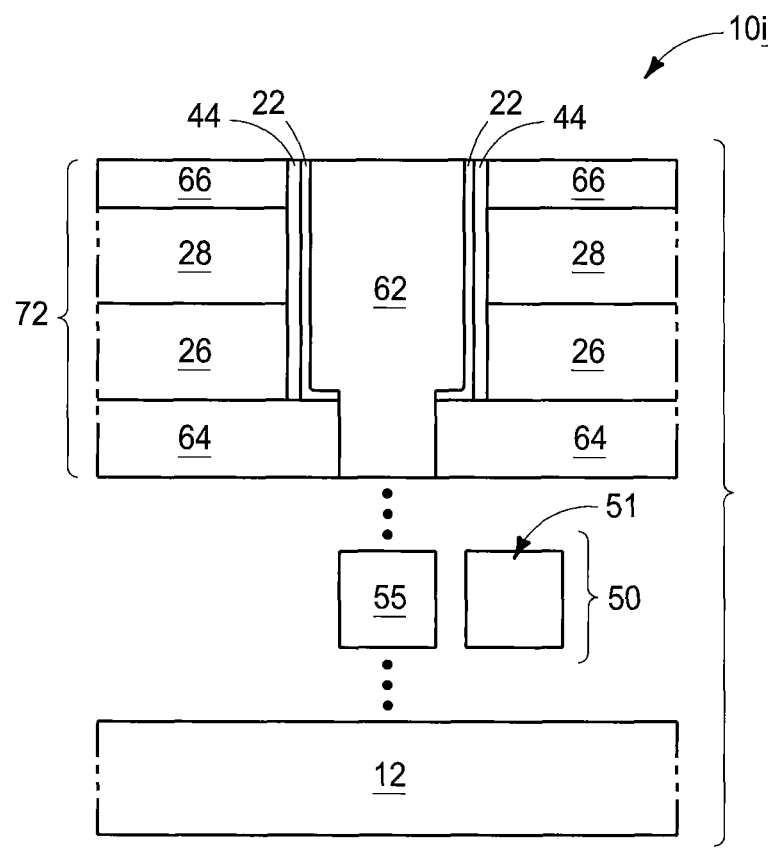
FIG. 19 is a diagrammatic cross-sectional side view of a portion of a semiconductor construction at a process stage of another example embodiment method of forming an example embodiment vertical transistor. The process stage of FIG. 19 may follow that of FIG. 17 in some embodiments.

In some embodiments, material 76 may be a sacrificial material, and may be removed prior to formation of semiconductor material 62. FIG. 19 shows a construction 10i at a processing stage subsequent to that of FIG. 17 in accordance with an embodiment in which spacer material 76 is removed prior to formation of semiconductor material 62.

In some embodiments, the processing of FIGS. 9-19 may be utilized to form a plurality of substantially identical devices which are incorporated into a NAND memory array.

The transistors, arrays and constructions discussed above may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, clocks, televisions, cell phones, personal computers, automobiles, industrial control systems, aircraft, etc.

The terms "dielectric" and "electrically insulative" are both utilized to describe materials having insulative electrical properties. Both terms are considered synonymous in this disclosure. The utilization of the term "dielectric" in some instances, and the term "electrically insulative" in other instances, is to provide language variation within this disclosure to simplify antecedent basis within the claims that follow, and is not utilized to indicate any significant chemical or electrical differences.

The particular orientation of the various embodiments in the drawings is for illustrative purposes only, and the embodiments may be rotated relative to the shown orientations in some applications. The description provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections in order to simplify the drawings.

When a structure is referred to above as being "on" or "against" another structure, it can be directly on the other structure or intervening structures may also be present. In contrast, when a structure is referred to as being "directly on" or "directly against" another structure, there are no intervening structures present. When a structure is referred to as being "connected" or "coupled" to another structure, it can be directly connected or coupled to the other structure, or intervening structures may be present. In contrast, when a structure is referred to as being "directly connected" or "directly coupled" to another structure, there are no intervening structures present.

In some embodiments, the invention includes a transistor. The transistor includes a channel region, gate dielectric directly against the channel region, and a first conductive gate portion along a first segment of the channel region. The first conductive gate portion is spaced from said first segment by at least the gate dielectric. The transistor also includes a second conductive gate portion along a second segment of the channel region, and spaced from said second segment by at least the gate dielectric. The second segment is adjacent to the first segment. The second conductive gate portion comprises a different composition from the first conductive gate portion.

In some embodiments, the invention includes a semiconductor construction. The construction includes a channel region. Gate dielectric is directly against the channel region, and a semiconductor-containing gate portion is along a first segment of the channel region and spaced from said first segment by at least the gate dielectric. The semiconductor-containing gate portion consists of conductively-doped semiconductor material. A metal-containing gate is along a second segment of the channel region and spaced from said second segment by at least the gate dielectric. The second segment is adjacent to the first segment. The semiconductor-containing gate portion, metal-containing gate portion, dielectric material and channel region comprise a transistor.

In some embodiments, the invention includes a method of forming a semiconductor construction. A vertically-extending NAND string is formed over a substantially horizontal primary surface of a base. The NAND string has a vertically-extending NAND string channel region. An electrically insulative material is formed over the NAND string channel region. A first semiconductor material is formed over the electrically insulative material. Metal-containing material is formed over the first semiconductor material. A first opening is formed to extend through the metal-containing material and the first semiconductor material to the electrically insulative material. A gate dielectric is formed along sidewalls and a bottom of the first opening. A second opening is formed through the gate dielectric at the bottom of the first opening and through the electrically insulative material. Second semiconductor material is formed within the first and second openings. A portion of the second semiconductor material within the first opening is spaced from the first semiconductor material and the metal-containing material by at least the gate dielectric and is a transistor channel region.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. A method of forming a semiconductor construction, comprising:
    forming a vertically-extending NAND string over a substantially horizontal primary surface of a base; the NAND string having a vertically-extending NAND string channel region;
    forming an electrically insulative material over the NAND string channel region;
    forming a first semiconductor material over the electrically insulative material;
    forming metal-containing material over the first semiconductor material;
    forming a first opening to extend through the metal-containing material and the first semiconductor material to the electrically insulative material;
    forming a gate dielectric along sidewalls and a bottom of the first opening;
    forming a second opening through the gate dielectric at the bottom of the first opening and through the electrically insulative material; and
    forming second semiconductor material within the first and second openings; a portion of the second semiconductor material within the first opening being spaced from the first semiconductor material and the metal-containing material by at least the gate dielectric, and being a transistor channel region.

2. The method of claim 1 further comprising forming a semiconductor material liner along sidewalls of the first opening prior to forming the gate dielectric.

3. The method of claim 2 wherein the semiconductor material liner comprises silicon.

4. The method of claim 1 further comprising forming an electrically conductive liner along sidewalls of the first opening prior to forming the gate dielectric.

5. The method of claim 4 wherein the liner comprises conductively-doped silicon.

6. The method of claim 1 further comprising:
    forming spacer material along the gate dielectric within the first opening prior to forming the second opening; and
    utilizing the spacer material as a mask during formation of the second opening.

7. The method of claim 6 wherein the spacer material comprises semiconductor material and is incorporated into the transistor channel region.

8. The method of claim 6 further comprising removing the spacer material prior to forming the second semiconductor material within the first and second openings.

9. The method of claim 1 wherein the first semiconductor material comprises silicon.

10. The method of claim 1 wherein the metal-containing material comprises titanium or tungsten.

11. The method of claim 1 wherein the metal-containing material comprises titanium nitride.

12. The method of claim 1 wherein the metal-containing material comprises tungsten silicide.

13. A method of forming a semiconductor construction, comprising:
    providing a vertically-extending NAND string having a vertically-extending NAND string channel region;
    forming an electrically insulative material over the NAND string channel region;
    forming a silicon-containing material over the electrically insulative material;

forming metal-containing material over the silicon-containing material, the metal-containing material comprising metal nitride or metal silicide;

forming a first opening to extend through the metal-containing material and the silicon-containing material to the electrically insulative material;

forming a gate dielectric along sidewalls and a bottom of the first opening;

forming a second opening through the gate dielectric at the bottom of the first opening and through the electrically insulative material; and forming semiconductor material within the first and second openings; a portion of the semiconductor material within the first opening being spaced from the silicon-containing material and the metal-containing material by at least the gate dielectric, and being a transistor channel region.

* * * * *